United States Patent
Bassous et al.

[11] Patent Number: 6,156,484
[45] Date of Patent: Dec. 5, 2000

[54] GRAY SCALE ETCHING FOR THIN FLEXIBLE INTERPOSER

[75] Inventors: Ernest Bassous, Bronx; Gobinda Das, Hopewell Junction; Frank Daniel Egitto, Binghamton, all of N.Y.; Natalie Barbara Feilchenfeld, Jericho, Vt.; Elizabeth F. Foster, Friendsville, Pa.; Stephen Joseph Fuerniss, Endicott; James Steven Kamperman, Endwell, both of N.Y.; Donald Joseph Mikalsen, Milford, Conn.; Michael Roy Scheuermann, Katonah; David Brian Stone, Owego, both of N.Y.

[73] Assignee: International Business Machines Corporation, Armonk, N.Y.

[21] Appl. No.: 09/021,758

[22] Filed: Feb. 11, 1998

Related U.S. Application Data

[60] Provisional application No. 60/064,621, Nov. 7, 1997.

[51] Int. Cl.[7] .................................................. G03F 7/00
[52] U.S. Cl. ........................ 430/313; 430/318; 216/83; 438/745; 438/754
[58] Field of Search ....................... 430/313, 318; 216/83; 438/745, 754

[56] References Cited

U.S. PATENT DOCUMENTS

| | | | |
|---|---|---|---|
| 4,374,911 | 2/1983 | Hartley | 430/5 |
| 4,551,409 | 11/1985 | Gulla | 430/192 |
| 4,786,545 | 11/1988 | Sakuma | 428/209 |
| 4,985,116 | 1/1991 | Mettler et al. | 156/656 |
| 5,020,217 | 6/1991 | Gonzales et al. | 29/882 |
| 5,071,787 | 12/1991 | Mori et al. | 437/183 |
| 5,207,585 | 5/1993 | Byrnes et al. | 439/66 |
| 5,234,536 | 8/1993 | Parthasarathi | 216/20 |
| 5,438,223 | 8/1995 | Higashi et al. | 257/774 |
| 5,575,662 | 11/1996 | Yamamoto et al. | 439/67 |
| 5,576,630 | 11/1996 | Fujita | 324/760 |
| 5,601,678 | 2/1997 | Gerber | 156/150 |
| 5,949,141 | 12/1999 | Farnworth | 257/737 |

FOREIGN PATENT DOCUMENTS 0433996   6/1991   European Pat. Off. .......... H01B 5/16

*Primary Examiner*—Kathleen Duda
*Assistant Examiner*—Nicole Barreca
*Attorney, Agent, or Firm*—Judith D. Olsen

[57] ABSTRACT

Disclosed is a sculpted probe pad and a gray scale etching process for making arrays of such probe pads on a thin flexible interposer for testing the electrical integrity of microelectronic devices at terminal metallurgy. Also used in the etching process is a novel fixture for holding the substrate and a novel mask for 1-step photolithographic exposure. The result of the invention is an array of test probes of preselected uniform topography, which make ohmic contact at all points to be tested simultaneously and nondestructively.

12 Claims, 7 Drawing Sheets

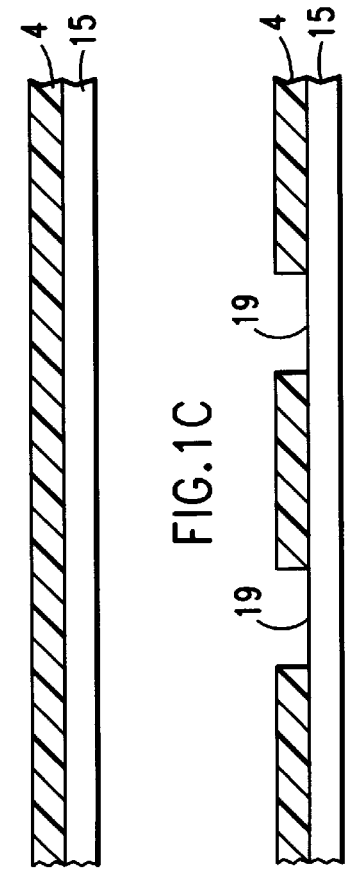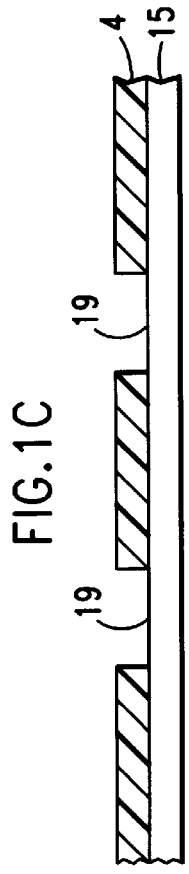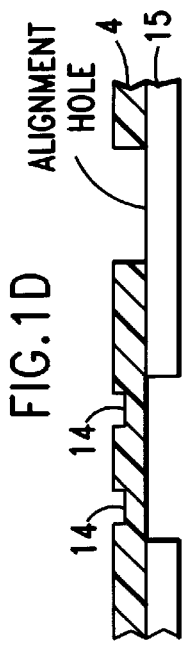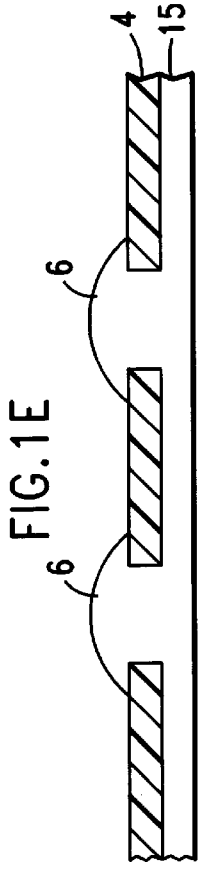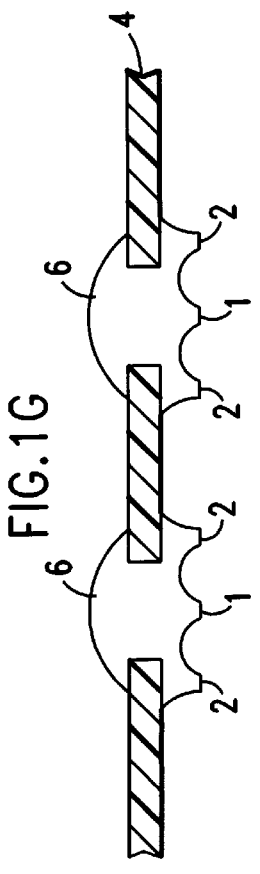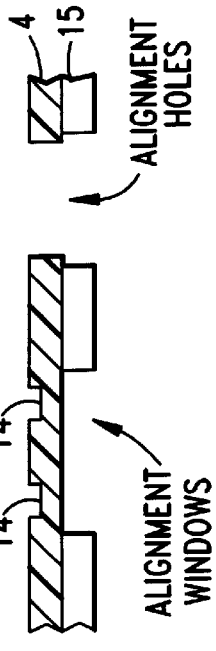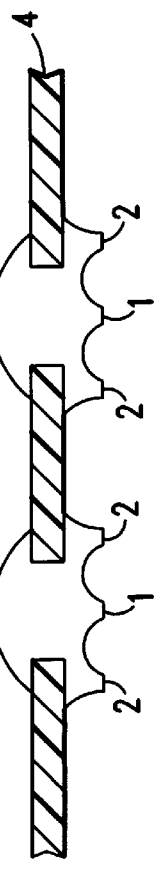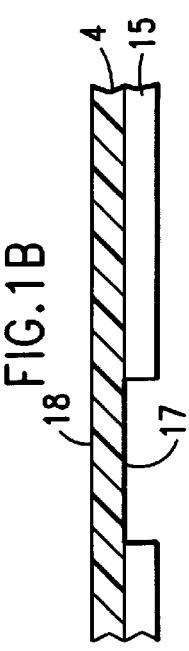

As-PROBED

GRAY SCALE ETCHING FOR THIN FLEXIBLE INTERPOSER

CLAIM OF PRIORITY

Priority is claimed on Provisional Application Serial No. 60/064,621, deposited in the United States Patent Office Nov. 7, 1997.

FIELD OF THE INVENTION

This invention relates to high density microminiaturized electronic circuit devices. More particularly, this invention relates to the formation of electrical contacts, also referred to herein as probes, having a sculpted topography for testing such devices.

BACKGROUND OF THE INVENTION

For the electronic testing of devices having C4 bump terminal metallurgy, the test contacts must be shaped in such a way as to provide ohmic contact with the C4s being tested while applying minimal force so as to avoid causing damage. Such contact must be made simultaneously with a large number of bumps, making control of the shape, distribution and dimensions of the probes a priority. Fabrication of such contacts has in the past been affected by problems, including lack of uniform mask conformity to the surface, chipping and cracking of polymer, difficulty of maintaining adhesion of photoresist to copper surfaces and limited resist shelf life between certain process steps. Furthermore, in a manufacturing environment, the number of process steps affects cost and must be minimized. To overcome the above mentioned and other problems, the present invention includes only one photolithographic masking step in the fabrication of sculpted, uniformly shaped contacts of predetermined distribution and dimensions, using a mask of unique design. The mask itself is comprised of two or more sizes of features, through which differing etch rates can be achieved in the areas of copper underlying areas in the photoresist that have been exposed using the mask and then developed. As a result, complete removal of metal is achieved in some areas, no removal in others and partial removal in other areas. The phenomenon producing this effect is called herein gray scale etching. This invention also includes use of a novel part handling fixture in the gray scale etch process which is advantageous for scaleup to a high volume manufacturing process.

U.S. Pat. No. 4,374,911 to Phillip A Hartley and assigned to the assignee of the present invention describes the fabrication of a photolithographic emulsion mask having at least three zones of light transmissibility. The variation in light transmissibility in the mask is referred to in the patent as "gray scale masking". The gray scale mask is made as a composite image from superimposing the images of at least two preliminary masks, a first one of which has a pattern of greater light transmissibility and a second diazo mask of lesser transmissibility which blocks in part selected portions of the first mask.

The present invention is not concerned with creating more than two areas of varying light transmissibility in a mask. In the present invention, all areas of the mask which transmit light transmit the same amount of light; all exposed areas of resist are totally exposed and developed, and all areas of the mask intended to transmit light radiation do so completely. The present invention uses the phenomenon of differential etch rate of a metal through varying dimensions and distribution of openings, the smaller openings etching more slowly than the larger, meaning that the larger openings can be completely etched while the smaller can be only partially etched and a sculpted effect is created.

In U.S. Pat. No. 4,985,116, Mettler et al describe a mask making process whereby a flexible plastic sheet, patterned in ink, is vacuum molded to conform to the surface of a three dimensional substrate, such as a printed wiring board or connectors, and is exposed to a YAG laser, which removes the plastic from ink-free areas, creating a removable, flexible mask for applying to the surface of the substrate for subsequent plating or etching in the exposed areas. The conformable mask, intended to replace rigid machined masks, provide improved image resolution in lines of about 20 and in spaces of about 30 mils. Alignment marks on the mask provide registration assistance; vacuum maintains physical contact of the mask to the substrate. The use of a mask and gray scale etching, or any process or fixture to control shape, height and distribution of microminiature contacts or other surface features as in the field of the present invention is not addressed.

In U.S. Pat. No. 5,020,217, Raphael A. Gonzales et al describe a method for providing contacts of preselected height and shape using discrete deformation of a metal sheet. Alternatively, the contacts are made by extrusion. The described process is mechanical, using tool and die, unsuitable for dimensions demanded in the field of the present invention, in which chemical processing is used to achieve microminiature contacts. Similarly, the problem addressed in the reference, i.e. avoiding the presence of foreign particles on the contacts of a "push-button" switch and like large devices, is not relevant to the present invention.

In U.S. Pat. No. 5,071,787, inventors Miki Mori et al describe several approaches to creating a sound electrical/mechanical bond between a wiring layer on an insulating substrate and a mounted semiconductor device bonded face down thereto. Contacts between the two levels is made though a set of conductive bumps on each, and through controlled heating up just below melting point of one set while the two sets are pressed together, plastic deformation removes any oxide that may interfere with the quality of the electrical contact at the joint. As described alternatively, one set of bumps on the semiconductor side may be sufficient, provided the composition of the bumps possesses a sufficiently low melting point. Since there is not yet hardened resin fixing the levels in place, any electrical repair that may be required after testing is more easily accomplished and the expensive alternative of having to discard the device rather than to repair it is avoided. The present invention is not addressed to semiconductor device mounting per se, but to sculpted microminiature probes for testing and the formation thereof by gray scale etching.

In U.S. Pat. No. 5,207,585 to Herbert P. Byrnes et al. and assigned to the same assignee as the present invention is described the thin interface pellicle, also referred to as the thin flexible interposer (TFI), and electrical contacts thereon for testing. The '585 patent is highly relevant to the present invention and is incorporated herein by reference. The present invention, however, is directed to the electrical contacts and the process of fabricating the electrical contacts rather than to the thin interface pellicle.

Of particular interest in the '585 patent is the description of the "Cobra Probe". The Cobra Probe typically requires cleaning after testing about every 4–5 wafers before reuse. Because of the constant demand for greater and greater density electronic devices, there is a need for fabrication of test devices that can handle densities higher than those tested by the Cobra Probe. The limitation of usefulness of the Cobra probe appears to be 4 on 8, meaning that the bumps to be tested are 4 mils in diameter and the distance between bumps, center to center, is 8 mils, the gap being 4 mils. This is expressed as a "pitch" of 4 on 8. A gap of less than 4 mils, involving a tighter pitch, has more stringent testing requirements than a Cobra type of probe appears able to supply. The needle point probe of Cobra, which is long and rather flexible, can be used up to about 200 MHz. The length of the Cobra Probe is prone to an impedance unsuitably high in the more aggressive environment of the future. The probes of the present invention are particularly suited for future stringent test requirements.

European Patent application (EPA) 90124611.6 to Yoshinari Takayama et al describes a conductive material independently piercing an insulating film in through-holes and having a bump-like projection layer larger than the through-hole to keep the conductive material in place therein. The EPA does not address the problem of making ohmic contact at a bump surface through an oxide layer, any advantages of a sculpted probe or the like. Etching described in the EPA is of the through-hole in an insulating film preparatory to the provision of a conductive path therethrough and of the conductive layer laminated on the insulating film. The bump-like projections are made e.g. by plating, not by etching. None of the above references addresses the problems, achieves the results or discloses the processes and apparatuses of the present invention.

SUMMARY OF THE INVENTION

Accordingly, it is an object of the invention to provide on a substrate, for example on a TFI, electronic test probes of preselected, controlled topography for use in the microcircuit environment.

It is a further object of the invention to provide test probes having predetermined topography and uniformity regardless of whether the substrate on which they are formed is strictly planar. Still another object of the invention is to provide test probes which have ohmic contact, with minimal applied force, simultaneously at all points in an array to be tested, and to do so with a minimum number of fabrication steps. It is a further object of the invention to provide test probes which are particularly suited for use in a high frequency, tight pitch environment. The foregoing and other objects are accomplished in the present invention by means of sculpted test probes, and by a method of fabrication of sculpted test probes which includes gray scale etching. Sculpted test probes are described which are arranged in an array on one major surface of an insulating material. Each probe in the array makes ohmic contact with a C4 in a mirror image placement of an array of C4 bumps. Because all probes in the array are the same height, each probe is able to contact each respective C4 simultaneously. Each probe is located in the center of its probe pad, and is tapered to a narrow tip. It is surrounded by an area in the copper that is sculpted out, stabilizing the probe. Test results are communicated from each probe through a conductive passage in the insulating material to a bump on the second major surface of the insulating material, to a pad from which the signals are detected.

The fabrication of the sculpted test probes is described, which includes exposure and development of a pattern in a photoresist layer overlying the copper of a copper-clad flexible insulating material. The copper is etched in a solution which removes copper from selected areas at varying rates, depending on the pattern of exposure and development of the resist. Smaller openings in the pattern etch more slowly than larger, leaving in the copper layer a gray scale pattern comprising the probes, probe pads and copper-free areas.

Also described are a fixture for use in etching the sculpted probes and a mask for providing the sizing and distribution of gray scale etched features as predetermined. The fixture which holds the flexible substrate for etching permits access by the spray etchant to both sides of the flexible substrate, increasing its stability, and holds the substrate recessed away from contact with rollers and other parts used in the etching process, preventing damage. The layout of the mask which is used to expose the resist and ultimately produce the gray scale pattern in the copper layer is designed to accommodate the relationship between sizes of openings and etch rates.

The mask is designed to capitalize on the fact that exposed and developed areas of smaller size will generally etch more slowly than those of larger size.

BRIEF DESCRIPTION OF THE DRAWINGS

FIG. 1 shows the major steps A–H in the probe fabrication process, B, D, F and H to the right in FIG. 1 are alignment figures.

DESCRIPTION OF THE PREFERRED EMBODIMENTS

In order to facilitate understanding of the present invention, reference is made to the following detailed description taken in conjunction with the drawings. The description of the process in conjunction with FIG. 1 is found in non-limiting Examples 1 and 2 below.

Figure 2:
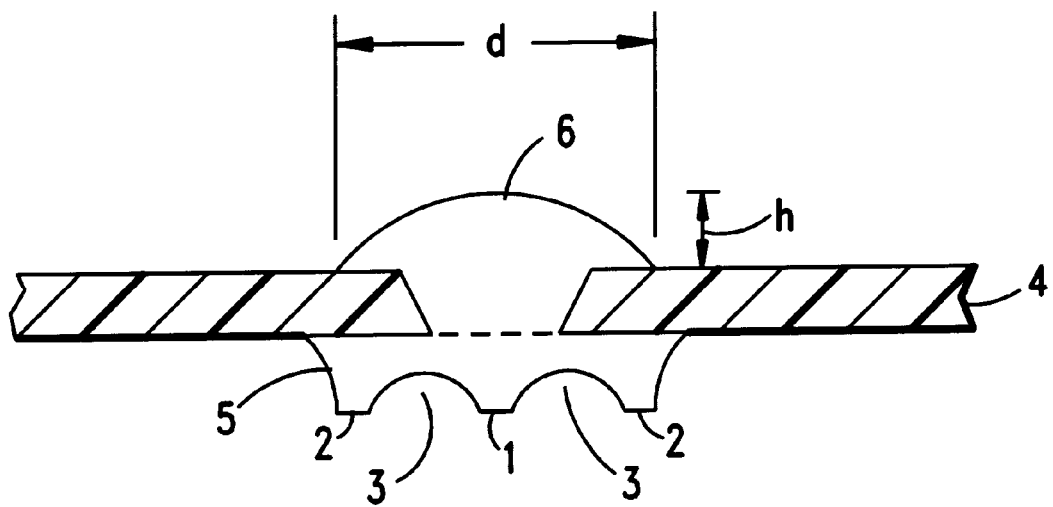
FIG. 2 shows an optimal probe topography.

In order to obtain ohmic contact for testing devices having C4 bumps as terminal technology, the oxide layer covering the C4 bumps, which may also be called pads, must be penetrated, and with as little force as possible. If the raised tip of the probe that comes in contact with the C4 pad is as small as possible, a good penetration of the oxide layer on the C4 can be expected. FIG. 2 is an illustration in cross section of a probe pad of the present invention. The probe itself is shown as feature 1. Features 2 are the shoulders surrounding sculpted areas 3. The probe pad is shown as feature 5. Feature 6 is a bump which provides electrical communication between probe 1 and ceramic space transformer 16 at land 13, represented in FIG. 7. Features 5 and 6 are aligned through flexible nonconducting substrate 4, which in the Examples is polyimide. A polyimide film found satisfactory is KAPTON, a trademark of E.I. DuPont de Nemours and Company. Feature 6 is typically about 1–2 mils in height from feature 4 and about 5 mils in diameter Feature 1 is typically about 1mil in height from feature 4.

Figure 3A:
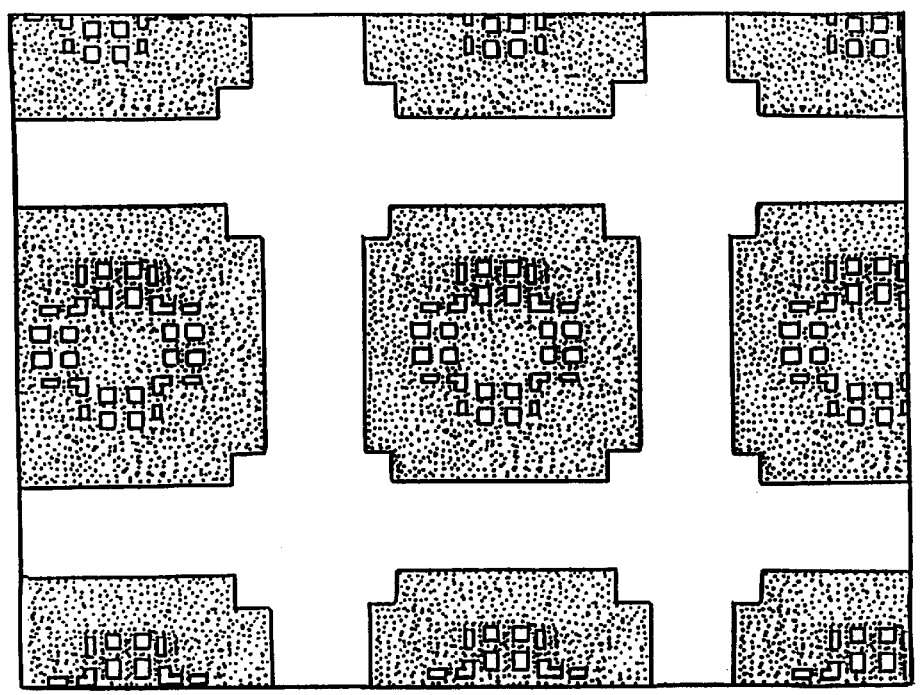
FIG. 3A is an example of a mask layout. It is used to form the probe pattern shown in the 3B optical micrograph.
Figure 3B:
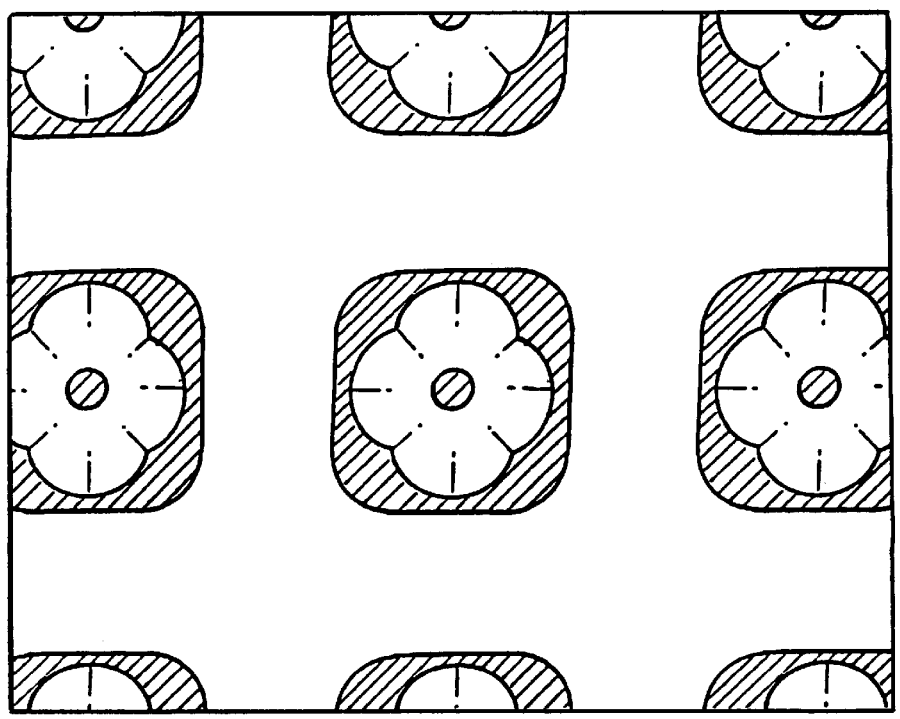
Figure 4A:
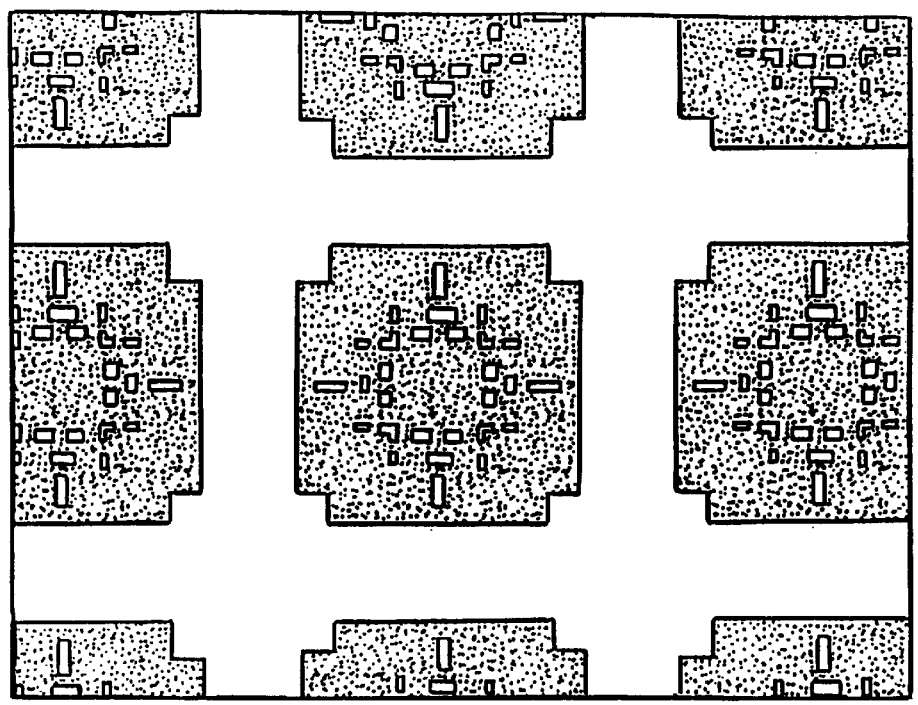
FIG. 4A is another example of a mask layout. It is used to form the probe pattern shown in the 4B optical micrograph.
Figure 4B:
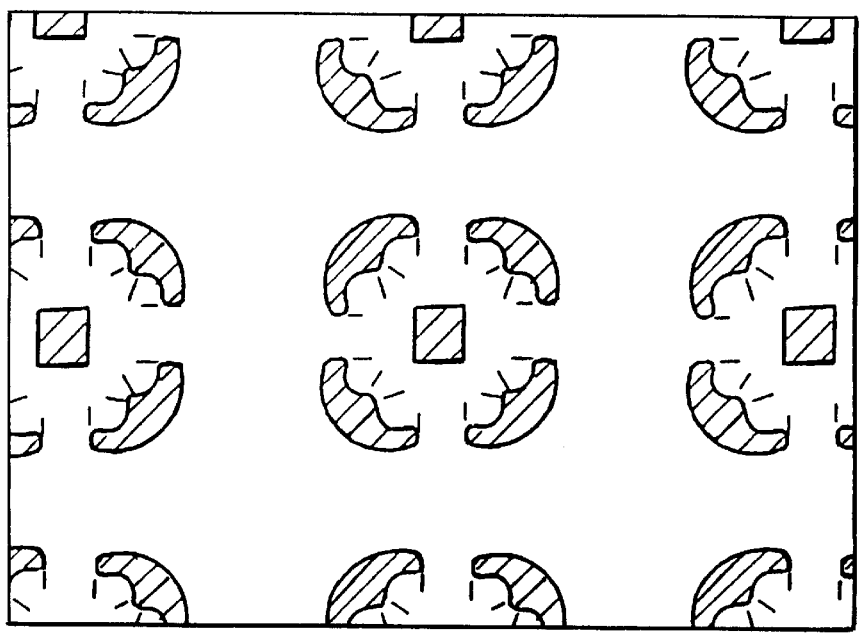
Figure 5:
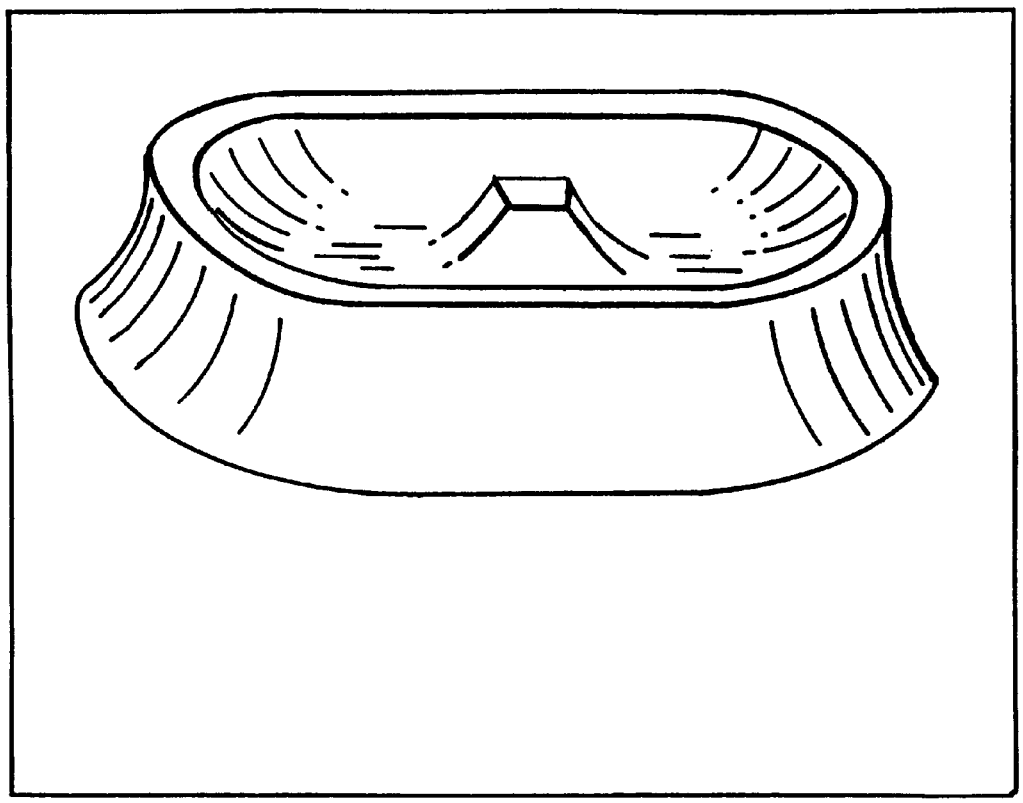
FIG. 5 is a scanning electron micrograph (SEM) of a sculpted, gray scale etched contact pad formed within any one of the probe patterns of 3B.

If all probes are the same height, all the C4 terminal pads will be touched at the same time and a successful test will be performed. This result is achieved and such probes have been fabricated in the present invention using a process in which the probes and the surrounding topography are provided using a single photolithographic mask. An example of one such mask is shown in the optical micrograph of FIG. 3A and another in the optical micrograph of FIG. 4A. The inventive process takes advantage of the fact that larger areas of copper exposed to etchant solution etch at a significantly higher rate than smaller areas. By controlling the size and arrangement of the openings exposed a mask and developed in a photosensitive resist, predetermined topographies are formed reproducibly in the underlying copper. The FIG. 3B optical micrograph is a top view of an array of probe pads made using the mask of FIG. 3A; The FIG. 4B optical micrograph is a top view of an array of probe pads made using the mask of FIG. 4A. In 3B and 4B, both the probes in the center of the pads and the shoulders of the probe pads, i.e. the prominent areas, are the light areas; the sculpted areas, i.e. the less prominent areas, are dark. FIG. 5 is a tilted SEM which shows in relief one of the probe pads of FIG. 3B. The probes, created by gray scale etching, are uniform in topography and are surrounded by sculpted areas of a second uniform topography, a number of identical such features being reproduced into an array as seen in part in 3B and in 4B. The tip of the probe at which electrical contact is made during testing is small as possible, and the distance across the top surface of the probe pad from shoulder to shoulder is large, giving an aspect ratio as high as possible. A ratio of about 1:4 is satisfactory.

Figure 6C:
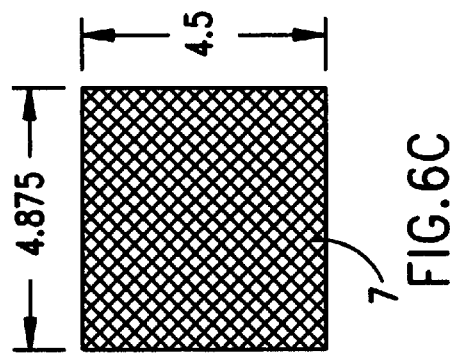
FIG. 6 shows the fixture for holding the TFI substrate during gray scale etching of the test probes.
Figure 6A:
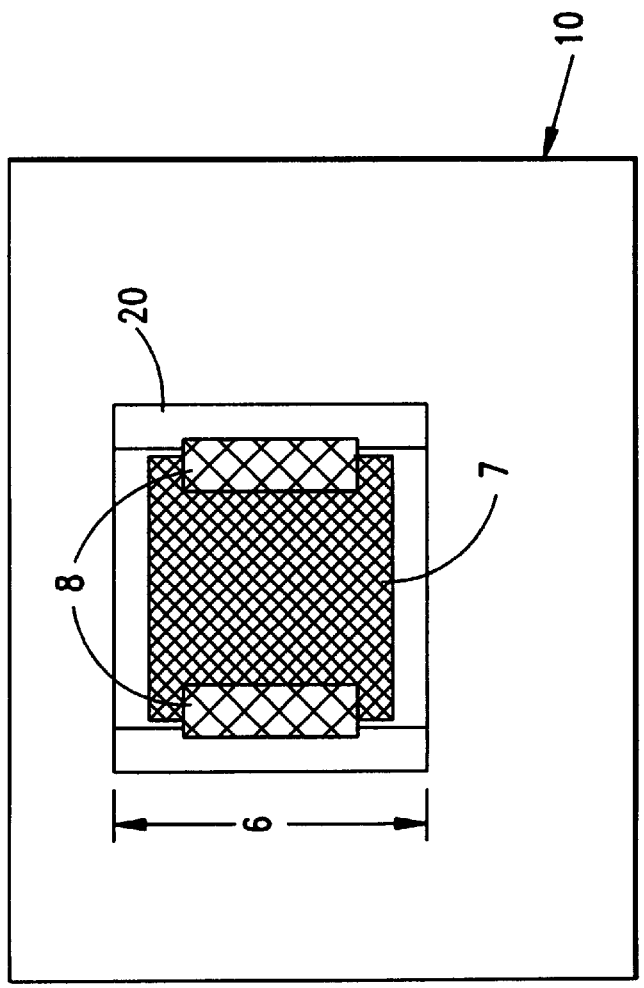
Figure 6B:
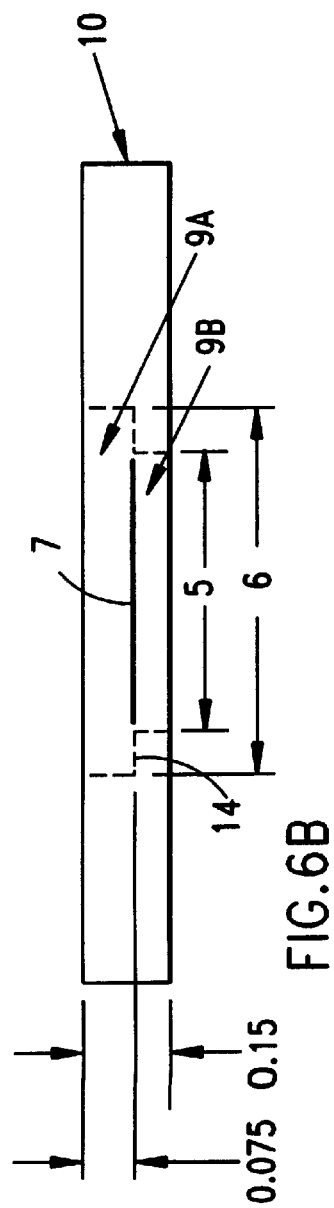

Etching must be performed over the entire surface of a substrate without damaging the photoresist or undercutting the adhesion of the photoresist to the copper. As further described in the Example below, the shelf life of the photoresist between the development of the pattern and the etch process must be sufficiently long to allow for normal delays in the production line. Resist adhesion has been optimized in the present invention by adjusting the time interval between resist application and partial curing on one hand, and final curing and exposure of the gray scale pattern on the other hand. Attention has also been paid to other factors affecting adhesion, such as selection of the thickness of the resist and use of an adhesion promoter. Etching is achieved in a standard etch solution for copper, such as a cupric chloride solution or a ferric chloride solution, which is delivered in a conveyorized spray etching system (not shown) followed by thorough rinsing in deionized (DI) water and drying with forced air. Etchant may be delivered to both exposed sides of a substrate for stabilization of a thin, flexible substrate. Uniformity is enhanced by etching the moving parts horizontally, with the major surface to be etched facing downward. The novel fixture (FIGS. 6A and 6B) prevents damage to the resist-coated TFI (feature 7 of FIG. 6A, 6B and 6C) by holding the TFI in a recess, allowing access of etchant solution to the TFI substrate while maintaining space between the surface of the TFI and the conveyor. Plating tape, shown in a view from the top as feature 8 in FIG. 6A, normally holds the TFI in place in the fixture on four sides rather than just the two shown. FIG. 6B shows the recessed areas as features 9A and 9B in a cross-sectional side view. The frame, which can also be referred to as the carrier, FIG. 6 feature 10, is comprised of a suitable nonconducting polymer. Dimensions on the FIGS. 6 are in inches for the fixture shown as an example. The substrate 7, also referred to herein as TFI or 4-up, is 4.875×4.5", the recess 9A being 6×6×0.075" and the recess 9B narrowing to 5×5×0.15. A lip 20, about 0.25" wide extends around the periphery separating 9A and 9B.

Copper on both the bump side (FIG. 2, feature 6) and the gray scale probe side FIG. 2, feature 5) are coated with a layer of nickel followed by a layer of gold, about 100 microinches each (not shown). The nickel serves as a barrier to interdiffusion of copper and gold and provides a mechanical benefit during use of the probe. For the bump plating process, which is prior to the gray scale etching, copper film FIG. 1E, feature 15 serves as an electrical commoning layer. The probes are gray scale etched, then plated in similar fashion. In this instance a commoning layer of copper, about 1.2 microns thick (not shown) is deposited over the gold plated bumps. The commoning layer is then covered with a layer of resist to prevent it from being plated during nickel and gold coating of the gray scale pads.

Following this last plating step, the resist is removed from the bump side and the commoning layer is etched away. Gold on the surfaces of the bumps and gray scale pads protect these features from the copper etchant during removal of the commoning layer.

Figures 7, 8:
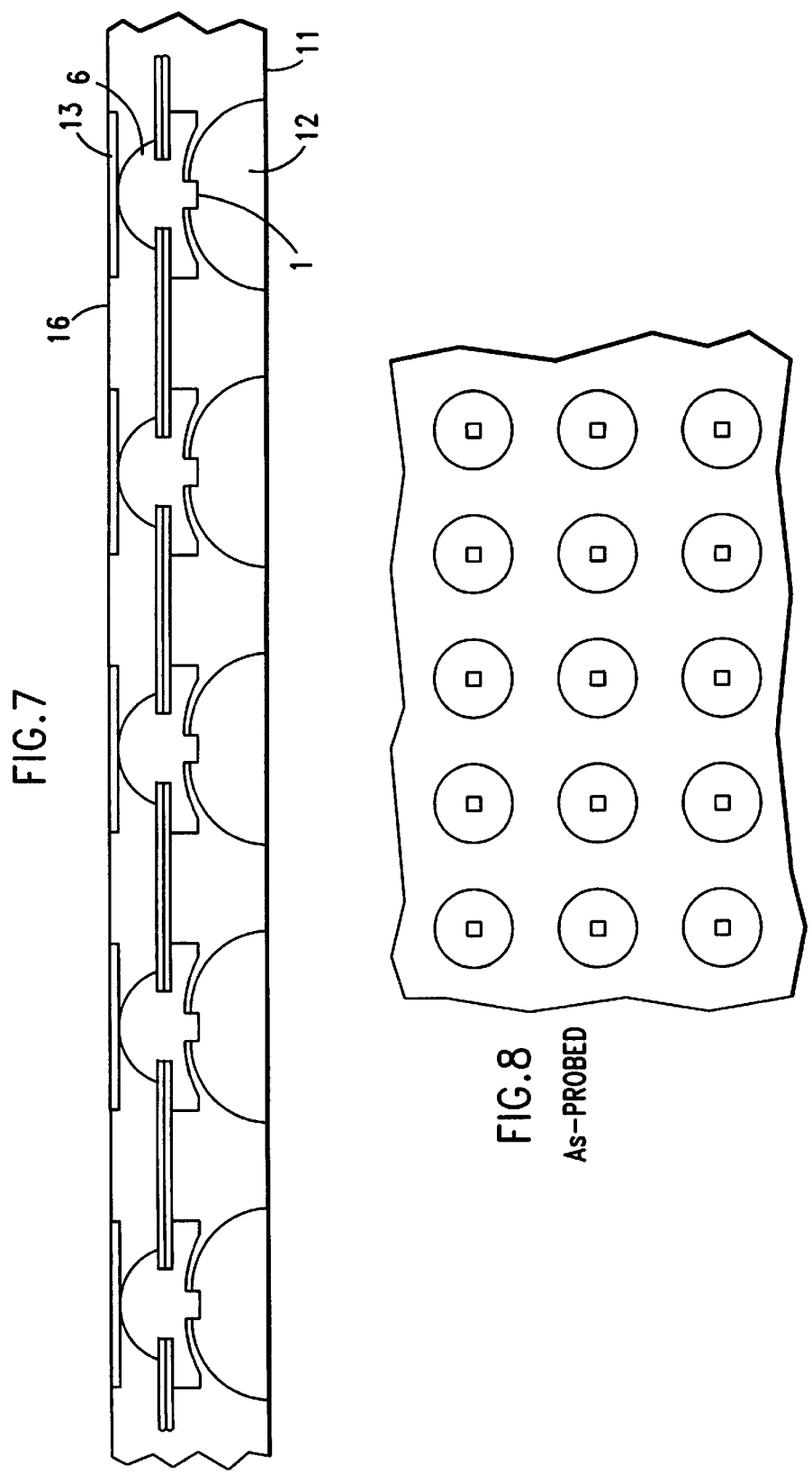
FIG. 7 shows a TFI with four of an array of test probes making contact with the C4 pads to be tested.
FIG. 8 is an SEM of pads which have been tested by probes of the present invention.

At this point the probes are ready to be used in testing. FIG. 7 shows an array of C4 bumps 12 on a silicon wafer 11 during contact. Gray scale-etched probes 1 were positioned in alignment on the C4s 12 such that the probe tip 1 will contact the C4 12 at or near its center. Bumps 6 are in contact with leads 13, which are ultimately connected to a space transformer 16. The probes 1 penetrate the oxide layer present on the surface of the C4s 12, which are typically comprised of solder, such that when the testing is completed and the array of probes is separated from the C4s, a residual indent mark is left at or near the center of the C4s, as shown in the FIG. 8 SEM, which is a top view of C4s after testing, magnified 100X.

Probes provided by the present invention typically have a useful life of about 20 to about 30 wafers before requiring cleaning for reuse, and can be used to test devices with switching speeds of about 150 to about 800 MHz. The short, rigid probe made by the process of the present invention maintains sufficiently low impedance for testing these higher frequency devices.

EXAMPLE 1

Turning to FIG. 1, the TFI probe fabrication process begins with a sheet of polyimide clad on one side with copper. FIG. 1A shows the polyimide (PI) 4 over copper 15. The copper/Kapton laminate is available in a thickness of ½, 1, 2, 3 and 5 mils. A product with excellent bond strength was obtained from Fortin Industries (Westinghouse) in Sylmar, Calif. One-mil polyimide (Kapton) clad with ¾ oz. copper is satisfactory.

The copper 15 surface is cleaned. The cleaning procedure for copper before lithography and plating is: a preliminary rinse in DI H2O, a 30 sec. rinse in ammonium persulfate solution of 120 gms/l, a 2 minute rinse in DI H2O, a 15 sec. rinse in 25% H2O4, and a final 2 min. rinse in DI H2O. After cleaning, the copper is coated with resist (not shown) in which alignment marks are optically exposed by UV light and developed, the copper in the developed areas is etched away (FIG. 1B, 17) and the remaining resist (not shown) is stripped. At this point the alignment window (FIG. 1B, 18) is seen.

The resist used was Shipley 1813J, spun on at 1500 RPM for 2 minutes, soft baked at about 85 to about 95 degrees C for about 45 minutes, exposed at about 50 to about 60 mJ and developed in Microposit 319MF for about 30 to about 45 seconds. No hard bake is performed, i.e. the resist is not completely cured.

An excimer laser is then used to ablate vias (FIG. 1C, 19) in the PI (FIG. 1A, 4) where copper bumps (FIG. 1E, 6) will be required. Molybdenum contact masks 2 mils thick, fabricated to order at Towne Labs, Somerville N.J., were used to mask the laser ablation of the vias (FIG. 1C, 19), but the alignment marks (FIG. 1D, 14) were created by partial ablation. A stationary beam from a Lambda Physik LPX-315 cc laser was used to scan the substrate through a one meter cylindrical lens to obtain a fluence of 1.6 J/cm2. The wavelength was 0.248 microns, 0.8 J/pulse, 8 pulse/second.

At this point it is necessary to strip resist (not shown) in acetone and clean away the residue in the ablated vias in a reactive ion etcher (RIE). A Plasma-Therm RIE is operated at 200 mTorr O2+2% CF4 at 0.25 W/cm2, f=13.5 MHz. Etch rate under these conditions is about 1500 A/min. Removal of residue in the vias ensures a strong adhesion in subsequent metallization of the vias.

Stycast 1266 epoxy obtained from Emerson and Cuming of Woburn, Mass. was used to mount in a stainless steel ring (not shown) the substrate to be treated by RIE. This epoxy was found to withstand the process without contaminating tools.

3M Scotch Brand 2-0300 plating tape is applied to the copper side of the copper/Kapton laminate prior to electroplating the vias 19. For large substrates a spin-on resist AZ 4620 from Hoechest Celanese in Somerville N.J. was found to withstand the plating bath.

Next copper is electroplated into the vias 19, and overplated up to about 2 mils to form bumps (FIG. 1E, 6). An electroplating bath of the following composition per liter of DI water was found to be satisfactory: 60 grams H2O4 (5H2O); 75 grams H2O4; 75 ppm Cl as HCl; 5 ml Cupracid HS leveling agent; 5 ml Cupracid brightener. The leveling agent and brightener were obtained from Chemcut Corp. of State College, Pa. The bath is replenished by adding 0.5 ml additional of leveler and of brightener per amp-hour.

Now attention is turned away from the bump side to the side on which probes 1 and the rest of the desired topography is to be created (FIG. 1G). Plating tape is removed and the resist is applied and soft baked. Using a mask such as the one in FIG. 3A or 4A, careful alignment is effected so that the bumps 6 will substantially align with the probes 1 to be gray scale etched, the predetermined result of which is shown in FIG. 1G. The bumps 6 are protected with resist as well. The TFI is placed in the fixture shown in FIG. 6 and is gray scale etched. Resist is removed in acetone from the bumps after which protective metallurgy (not shown) is applied to the bumps 6 and the probe pads 5. The protective metallurgy may be Ni coated with Au, or Rh or Cr. To avoid the use of cyanide complexed plating solutions, plating pens obtained from Hunter products of Bridgewater, N.J. can be used to coat Ni, Au and Rh. Alternatively, Au immersion plating baths are available from Occidental Chemical Corp. of Nutley N.J. Chrome can be sputter deposited or evaporated through a mask.

EXAMPLE 2

A 10"×15" panel of 25 microns thick polyimide (FIG. 1A, 4) is coated with 25 microns of copper (FIG. 1A, 15) on one major surface. Taller probes can be fabricated if a thicker coating of copper is used as a starting point. Copper is plated into blind vias (FIG. 1C, 19), which are about 85 microns in diameter, such that the copper fills the vias and forms a bump (FIG. 1E, 6) on each, having a height of about 1–2 mil above the surface of the polyimide and a diameter at the base of the bump of about 125 microns. The copper bumps are plated with about 2.5 microns of nickel followed by about 2.5 microns of gold (not shown). The panel includes 24 partially fabricated thin flexible interposer probes arranged in six groups such that each group contains four probes s (4-up).

Tooling holes are punched into the two ends of the panel along the 10 inch dimension and the panel is placed into a frame. The frame and panel are placed for two minutes into K2 solution, a highly alkaline cleaning solution from Penwalt Corporation. Next is sequential rinsing in DI water for one minute in each of two tanks, followed by exposure to a solution of sodium persulfate and two more DI water rinses, then immersion for about 30 seconds in a solution of 8% hydrochloric acid, two DI water rinses of about one minute each, about 20 seconds in a solution of sodium carbonate, two more one minute DI water rinses for about one minute each, immersion in benzotriazole alkaline cleaner for 1.5 minutes, two DI water rinses of 1 minute each, and drying for 15 minutes at 130 degrees C.

At this point the panel is cut into six 4-ups, each 4-up having dimensions of roughly 4.7"×4.7" (FIG. 6C). A convection oven preheated to 90 degrees C is allowed to stabilize for 30 minutes. Fifty grams of photoresist, an IBM formulation distributed by Microchem Corporation as SJR5440, is placed in a tared bottle with 8 grams of propylene glycol methyl ether acetate obtained from Aldrich Chemical and the two are mixed well by shaking. On a spin coater, a piece of filter paper is placed on a vacuum chuck, a 4-up is centered on the chuck such that the bump side is facing up, and vacuum is applied. The SJR5440 resist mixture is pipetted onto each quadrant of the 4-up and a drop of resist about 25 mm in diameter is placed in the center of the substrate. Each 4-up substrate is spun for 30 seconds at 2500 rpm. The coated substrate is removed from the chuck, placed on a copper sheet and air dried in an exhausted fume hood for a minimum of 15 minutes. The substrates are then placed for a minimum of 15 minutes in an oven preheated to 90 degrees C. The substrates are then removed from the oven and placed under the hood to cool for 20 minutes at room temperature. Using the spin coater, the same procedure is used to coat the copper side of each 4-up. For this side, resist is applied evenly to cover about ⅔ of the substrate surface at the center. After spinning, the substrate is coated as outlined above, the substrate is removed from the chuck and placed on a copper sheet to air dry at room temperature for an hour (about 1 to about 4 hours). The substrates are again placed in the oven for about 10 minutes at 90 degrees C., after which they are removed from the oven and placed under the hood to cool at room temperature. The final resist thickness on each side of the substrate is about 3 to 4 microns. It has been observed that resist adhesion is better for thicker than for thinner films. At this point the substrates are placed in an opaque box for a minimum of 12 hours (about 12 to about 72 hours) before proceeding to the next step. Substrates are placed in a fixture for photolithographic exposure in UV light. The substrate resides on a pliant pad that is porous enough to allow the substrate to be held in place by vacuum. The mask is aligned to the substrate, which is copper side up. The resist coating the copper substrate is exposed through the mask at 200 mJ per square centimeter.

Developer solution is prepared by diluting 0.5 N potassium hydroxide 1:1 with DI water. The resulting solution is maintained at 22+/−2 degrees C. The substrate is immersed in the solution for about 50 seconds using slight agitation, then rinsed for about 30 seconds in overflowing DI water. The substrate is dried in a stream of nitrogen.

The substrate is taped along four edges, stretching it taut into the fixture shown in FIG. 6A, and is held in the fixture in such a way that the surfaces of the substrate are recessed with respect to the surface of the fixture (FIG. 6B), preventing contact of the substrate surfaces with the rollers of the conveyorized etcher and avoiding chipping and scratching of the photoresist. The etching system is designed such that the frame is transported using pinch rollers that contact only the fixture, not the substrates.

The fixture is then placed in a conveyorized oscillating spray etching system such that the imaged side of the photoresist is facing down. Both sides of the substrate are exposed to etchant to prevent entrapment of solution behind the substrate. The etchant solution is a mixture of cupric chloride, 1.2+/−0.03 N hydrochloric acid and water maintained at 130+/−2 degrees F. The redox level is 515–600 mVolts. The specific gravity of the etchant is 1.26–1.28, Baume reading at 30+/−1 Baume. Etchant is dispensed through oscillating nozzles at a pressure of about 16 psi directed at the substrate. (Etching apparatus is not shown.) Nominal conveyor speed is 46 in./min. The length of the etching zone is about 48 inches. Etching is followed by a 1.0 N hydrochloric acid rinse, a water rinse and drying in a stream of air. To remove the photoresist, both sides of the substrate are exposed to UV light at 400 mJ per square centimeter, the substrate is immersed in 0.25 N sodium hydroxide at room temperature for about two minutes, rinsed in cascading DI water for about one minute and dried in a stream of air.

A layer of copper about 1.2 microns thick (not shown) is sputter deposited onto the gold coated bumps on each substrate. This serves to electrically common all of the bumps, and therefore the gray scale etched probe pads, for electrolytic plating of nickel and gold. A dry film photoresist 3 mils thick (not shown) is placed over this sputtered surface except at the four corners where electrical contact to the sputtered commoning layer will be required. Nickel and then gold, about 2.5 microns each (not shown), are next plated. The photoresist is then stripped in 0.25 N NaOH at room temperature and the commoning layer is etched in 0.5 N ammonium persulfate solution at room temperature.

While the invention has been described in conjunction with specific embodiments, many modifications will be apparent to those skilled in the art in light of the foregoing information. For example the description has focussed on array probing of C4 pads. Those skilled in the art could apply the teachings to peripheral pads as well. Accordingly, it is intended that the present invention embrace all such modifications as fall within the spirit and broad scope of the appended claims.

What is claimed is:

1. A method of forming a plurality of sculpted electrical test probe contacts in an array, comprising the steps of:
   providing an electrically conductive layer of preselected thickness directly laminated to a flexible non-conductive layer, the laminated layers together comprising one adhesive-free substrate the non-conductive layer having been provided with vias plated to form a plurality of overplated contact bumps in an array;
   forming on the conductive layer a resist mask having a distribution of openings of preselected dimensions in alignment with the overplated vias, the distribution being in a gray scale variation pattern to allow subsequent etching to take place at varying rates as a function of the dimensions of the openings within the pattern; and
   wet etching the electrically conductive layer through the openings whereby a plurality of sculpted electrical test probe contacts is formed in an array, each being in electrical communication with an overplated bump through a plated via and each having a central probe surrounded by a sculpted area which is itself surrounded by a shoulder area, the test probe contacts being electrically separated from one another by a completely etched area.

2. The method set forth in claim 1, wherein the conductive layer comprises copper of a thickness determined by the height desired for the probes.

3. The method set forth in claim 2, wherein the copper is about 1 mil in thickness.

4. The method set forth in claim 1, wherein the non-conductive layer comprises a polymer.

5. The method set forth in claim 1, wherein the non-conductive layer comprises a polyimide.

6. The method set forth in claim 1, wherein the mask is comprised of a photosensitive material about 3–4 microns thick.

7. The method set forth in claim 6, wherein the photosensitive material comprises a novolac resist.

8. The method set forth in claim 1, wherein the step of wet etching comprises etching in a solution selected from the group consisting of cupric chloride solution and ferric chloride solution.

9. The method set forth in claim 1, wherein the step of wet etching comprises etching in an oscillating spray which applies etchant simultaneously to both sides of the flexible substrate with about equal force.

10. The method set forth in claim 1, including the additional step of coating the sculpted test probe contacts with a layer of nickel followed by coating with a layer selected from the group consisting of gold, rhodium and chromium.

11. The method set forth in claim 10, wherein the nickel layer and the layer selected from the group consisting of gold, rhodium and chromium are each coated to a thickness of about 0.25–5.0 microns.

12. A method for making on a flexible substrate a double sided array for testing high frequency integrated circuit devices having C4 bumps as terminal technology, comprising:
   a. providing a flexible electrically nonconducting sheet clad on one side with copper having alignment marks photolithographically fabricated thereon;
   b. laser ablating through the nonconducting sheet side an array of vias at locations where contact bumps will be required;
   c. using the copper side as a commoning layer, electroplating through the vias and overplating to form contact bumps;
   d. coating the overplated contact bumps with a conductor which is impervious to copper etchant solution;
   e. providing the copper side with a photoresist mask which has been exposed and developed in a gray scale pattern for etching in the copper an array of probe pads, each probe pad being in alignment and electrical communication with a plated via;
   f. etching the array of probe pads to form a prominent central probe surrounded by a partially etched, sculpted area which is itself surrounded by a shoulder area of the same height as the central probe, copper being completely etched from areas outside the individual probe pads; and
   g. coating the probe pads with nickel followed by a conductor selected from the group consisting of gold, rhodium and chromium.

* * * * *